US006717857B2

(12) United States Patent
Byeon et al.

(10) Patent No.: US 6,717,857 B2
(45) Date of Patent: Apr. 6, 2004

(54) NON-VOLATILE SEMICONDUCTOR MEMORY DEVICE WITH CACHE FUNCTION AND PROGRAM, READ, AND PAGE COPY-BACK OPERATIONS THEREOF

(75) Inventors: Dae-Seok Byeon, Seoul (KR); Young-Ho Lim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/279,386

(22) Filed: Oct. 23, 2002

(65) Prior Publication Data

US 2003/0076719 A1 Apr. 24, 2003

(30) Foreign Application Priority Data

Oct. 24, 2001 (KR) ..................................... 2001-065766

(51) Int. Cl.$^7$ ............................................... G11C 11/34
(52) U.S. Cl. .............................. 365/185.21; 365/185.17
(58) Field of Search ....................... 365/185.17, 185.22, 365/185.21

(56) References Cited

U.S. PATENT DOCUMENTS

| 5,473,563 | A | | 12/1995 | Suh et al. ............... 365/185.13 |
| 5,696,717 | A | | 12/1997 | Koh ....................... 365/185.22 |
| 5,996,041 | A | | 11/1999 | Kim ........................... 711/103 |
| 6,104,640 | A | * | 8/2000 | Banks .................... 365/189.01 |

* cited by examiner

Primary Examiner—Michael Tran
(74) Attorney, Agent, or Firm—Marger Johnson & McCollom, P.C.

(57) ABSTRACT

A non-volatile memory device according to embodiments of the invention includes a page buffer acting as a sense amplifier during a read operation and as a write driver during a program operation. The page buffer has two sense and latch blocks, which exclusively carry out the same function. While one of the sense and latch blocks carries out a read operation, the other sense and latch block outputs previously sensed data to the exterior. Further, while one of the sense and latch blocks carries out a program operation, the other sense and latch block loads data to be programmed. Due to the page buffer, an operation speed of the non-volatile memory device can be enhanced.

36 Claims, 12 Drawing Sheets

NON-VOLATILE SEMICONDUCTOR MEMORY DEVICE WITH CACHE FUNCTION AND PROGRAM, READ, AND PAGE COPY-BACK OPERATIONS THEREOF

RELATED APPLICATION

This application claims priority from Korean Patent Application No. 2001-65766, filed on Oct. 24, 2001, the contents of which are herein incorporated by reference in their entirety.

FIELD OF THE INVENTION

This disclosure relates to data storage devices and, more particularly, to a device for writing/reading data to/from a memory cell.

BACKGROUND OF THE INVENTION

Semiconductor memory devices are typically classified into volatile memory devices and non-volatile memory devices. The volatile memory devices are subdivided into dynamic random access memories (DRAMs) and static random access memories (SRAMs). The volatile semiconductor devices read/write data at high speed, but lose their data when their power supplies are interrupted. The non-volatile memory can include mask read-only memories (MROMs), programmable read-only memories (PROMs), erasable programmable read-only memories (EPROMs), and electrically erasable programmable read-only memories (EEPROMs). The non-volatile memory devices retain their stored data even when their power supplies are interrupted. Thus, the non-volatile memories are widely used to store retention-required data irrespective of power supply interruption.

However, MROMs, PROMs, and EPROMs have difficulty in rewriting stored data because read and write operations cannot be freely conducted by normal users. On the other hand, EEPROMs are increasingly used in system programming that requires the continuous update or auxiliary memory devices. Particularly, flash EEPROMs are very advantageous to be used as mass storage devices because their integration density is high as compared to conventional EEPROMs. Among the flash EEPROMs, a NAND-type flash EEPROM has a very high integration density as compared to a NOR-type or AND-type flash EEPROM.

A flash EEPROM includes a memory cell array as a data storage area. Referring to FIG. 1, a memory cell array 10 has a plurality of cell strings (or NAND strings) each being respectively coupled to corresponding bitlines. Each of the cell strings 12 includes a string selecting transistor SST coupled to a corresponding bitline (e.g., BL0), a ground selecting transistor GST coupled to a common source line CSL, and memory cells MC0-MCm serially coupled between the string and ground selecting transistors SST and GST. The string selecting transistor SST, the memory cells MC0-MCm, and the ground selecting transistors GST are coupled to a string selecting line SSL, wordlines WL0-WLm, and a ground selecting line GSL, respectively. The lines SSL, WL0-WLm, and GSL are electrically connected to a row decoder circuit 12. Bitlines BL0-BLn are electrically connected to a page buffer circuit 14.

Each of memory cells constituting respective cell strings includes a floating gate transistor having a source, a drain, a floating gate, and a control gate. It is well known that a memory cell of a NAND-type flash EEPROM is erased and programmed using F-N (Fowler-Nordheim) tunneling current. Methods of erasing and programming a NAND-type flash EEPROM are disclosed in, for instance, U.S. Pat. No. 5,473,563 entitled "NONVOLATILE SEMICONDUCTOR MEMORY", and U.S. Pat. No. 5,696,717 entitled "NON-VOLATILE INTEGRATED CIRCUIT MEMORY DEVICE HAVING ADJUSTABLE ERASE/PROGRAM THRESHOLD VERIFICATION CAPABILITY".

In order to store data in a memory cell array, a data loading command is applied to a flash EEPROM, and then an address and data are inputted thereto. Generally, data to be programmed are sequentially transferred to a page buffer circuit by a byte or word unit. When the data to be programmed, i.e., a page of data are all loaded to the page buffer circuit, the data stored in the page buffer circuit are programmed to a memory cell array at the same time.

In case of a NAND-type flash EEPROM, it takes about 200–500 microseconds to program 512-bytes of data information, for example. It takes about 100 nanoseconds to load byte or word data into a page buffer circuit. Therefore, it takes approximately 50 microseconds to load all 512-bytes of data information into the page buffer circuit (i.e., data load time is approximately 50 microseconds). Total program time Ttotal_PGM is defined as (tLOAD+tPROGRAM)×N (wherein tLOAD, tPROGRAM, and N represent data load time, practical program time, and the number of program cycles, respectively). In a case where program operations are successively carried out, the data load time tLOAD occupies a sizable proportion of the total program time tTOTAL_PGM. This entails considerable difficulty in constructing a high-speed NAND-type flash EEPROM.

In a case where a page size is increased, the data load time tLOAD is increased in proportion to the increased page size, while keeping the practical program time tPROGRAM. In a case where program operations are successively carried out, the total program time tTOTAL_PGM is considerably increased. This is because the next data to be programmed in the NAND-type flash EEPROMcan be loaded to a page buffer circuit only after completely programming previously loaded data. Thus, an increase in the total program time tTOTAL_PGM has an influence upon data storage characteristics of the NAND-type flash EEPROM. For example, a program speed of the NAND-type flash EEPROM is greatly reduced with increase in the page size.

The NAND-type flash EEPROM supports a page copy-back operation, which means data information can be copied from one page to another page without being output to an exterior. One example of a NAND-type flash EEPROM supporting the copy-back operation is disclosed in U.S. Pat. No. 5,996,041 entitled "INTEGRATED CIRCUIT MEMORY DEVICES HAVING PAGE FLAG CELLS WHICH INDICATE THE TRUE OR NON-TRUE STATE OF PAGE DATA THEREIN AND METHOD OF OPERATING THE SAME", which is incorporated herein by reference for all purposes. According to the above reference, a page copy flag cell is provided for storing information to detect whether the copied page data is inverted. That is, a flag cell string 16 coupled to a flag bitline FBL is further provided to a memory cell array 10, as shown in FIG. 1. Substantially, the flag cell string 16 has the same construction as other cell strings 12.

If there is a defect in a page copy flag cell, page data of the defective page copy flag cell cannot be guaranteed. Even though memory cells substantially constructing a page are normal, normal page data cannot be guaranteed due to the defective flag cell belonging to the page. As a result, a page copy flag cell provided for a page copy-back operation becomes an obstruction in securing a reliability of the NAND-type flash EEPROM. Moreover, when data information is read out from a selected page, there is a need for an additional circuit (see FIG. 4 of U.S. Pat. No. 5,996,041; XOR gates) that allows the data information to be outputted as its inverted version or in its entirety.

Embodiments of the invention address this and other limitations of the prior art.

SUMMARY OF THE INVENTION

Embodiments of the present invention provide a flash memory device having a page buffer circuit with a cache function.

These embodiments can perform a copy-back operation without the need for a separate copy flag cell.

Further embodiments of the present invention provide a flash memory device that prevents the deterioration of a data storage characteristic, and can enhance read and program operation speeds.

DESCRIPTION OF THE PREFERRED EMBODIMENTS

A flash memory device according to embodiments of the invention supports a cache function by constructing a page buffer having two sense and latch blocks. The sense and latch blocks can carry out read, program, and page copy-back operations independently and exclusively. The "cache function" means that next page data to be programmed is loaded to a page buffer circuit while programming previously loaded page data. That is, when program operations are successively performed, a time required for loading page data is not needed except a first page data loading time. Thus, the total program time can be reduced. Further, the "cache function" means that previously sensed page data is outputted to an exterior while sensing page data. That is, a time required for outputting the page data is not needed except a first page data output time. Additionally, the flash memory device supports read and copy-back function or a page copy-back function. This page copy-back function does not need a copy flag cell for storing information to detect whether copied page data is inverted. Therefore, a reliability-falling cause can be eradicated. This will be explained in detail later.

Figure 1:
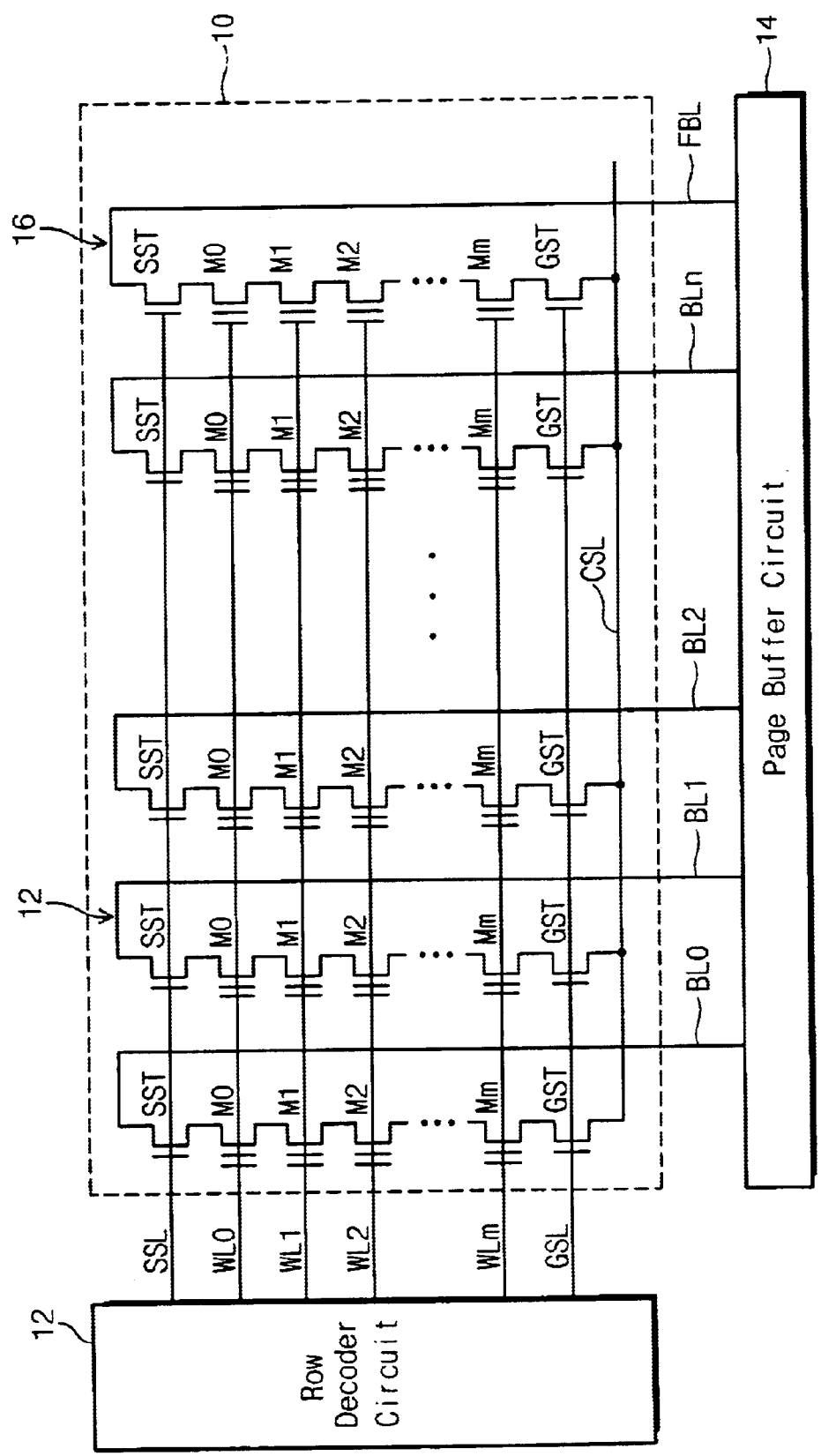
FIG. 1 is a block diagram of a flash memory device according to the prior art.
Figure 2:
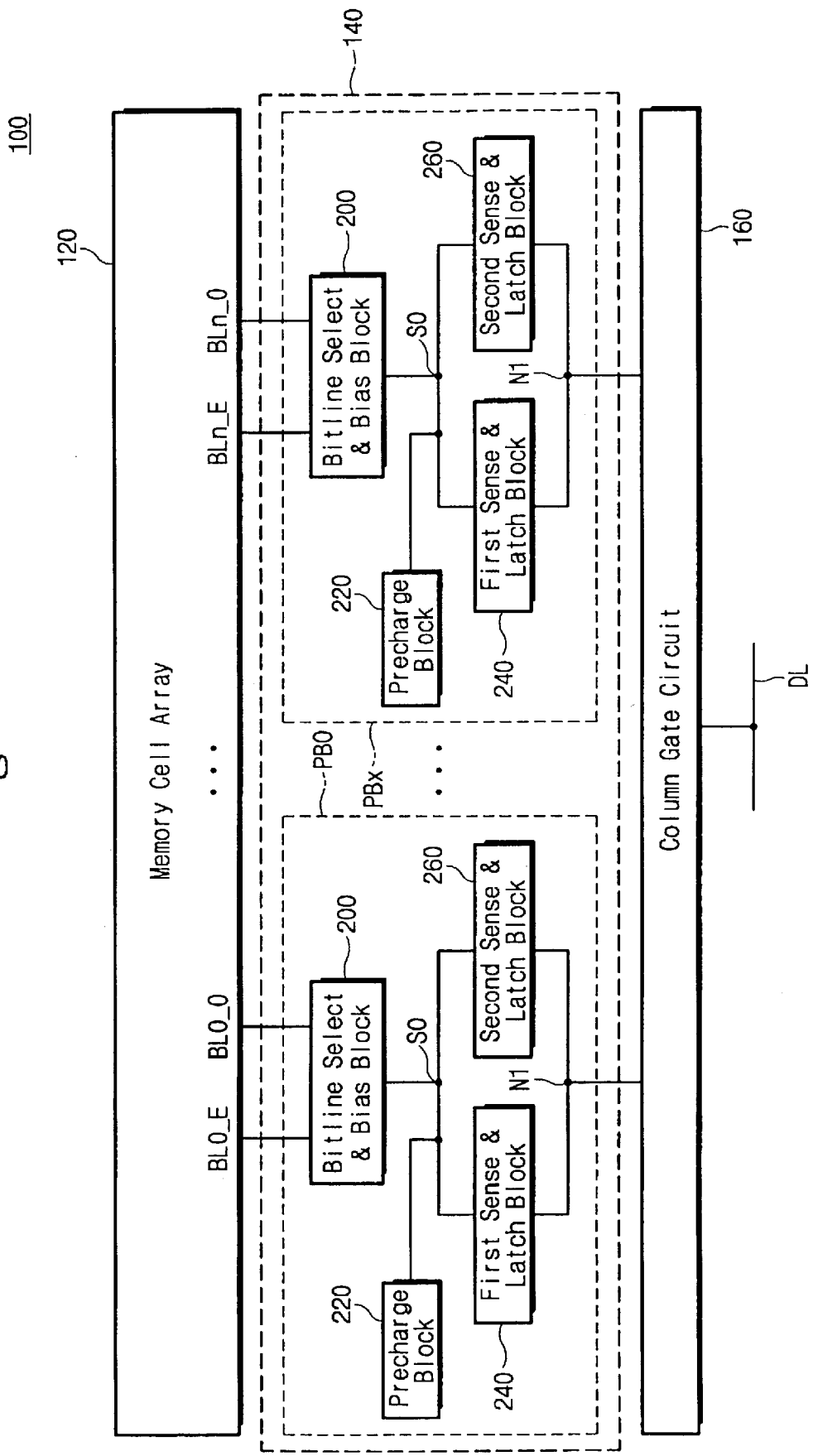
FIG. 2 is a block diagram of a flash memory device according to an embodiment of the present invention.

As shown in FIG. 2, a flash memory device 100 according to the embodiments of the invention includes a memory cell array 120, a page buffer circuit 140, and a column gate circuit 160. The memory cell 120 array has a plurality of cell strings, which may be constructed as shown in FIG. 1. The cell strings are each electrically connected to their corresponding bitlines (BL0_E, BL0_O)~(BLn_E, BLn_O). Two adjacent bitlines constitute a bitline pair (or bitline group). Unlike prior memory devices, it is unnecessary to provide a separate flag cell string to the memory cell array 120.

In a flash memory device according to embodiments of the invention, one row or wordline includes two pages. It is apparent those skilled in the art that a page size is variable with memory products.

The bitlines (BL0_E, BL0_O)~(BLn_E, BLn_O) are electrically connected to the page buffer circuit 140, which acts as a register for temporarily storing data. The page buffer circuit 140 has a plurality of unit page buffers PB each corresponding to a bitline pair. For example, a first group of bitlines (BL0_E, BL0_O) are coupled to a first page buffer PB0, and a second group of bitlines (BL1_E, BL1_O) are coupled to a second page buffer PB1.

Each of page buffers PB0-PBx has a bitline select and bias block 200, a precharge block 220, a first sense and latch block 240, and a second sense and latch block 260. The same numerals denote the same components of each page buffer. In each of the page buffer PB0-PBx, the bitline select and bias block 200 selects one of a corresponding group or pair of bitlines (BL0_E, BL0_O), and connects the selected bitline to a sense node SO. The precharge block 220 precharges the sense node SO. The first and second sense and latch blocks 240 and 260 are coupled between the sense node SO and an internal node N1 in parallel. The internal node N1 is coupled to a data bus (only one data line DL is illustrated for simplifying the figure) via the column gate circuit 160. An example detailed circuit configuration of the respective blocks is described below with reference to FIG. 3.

Figure 3:
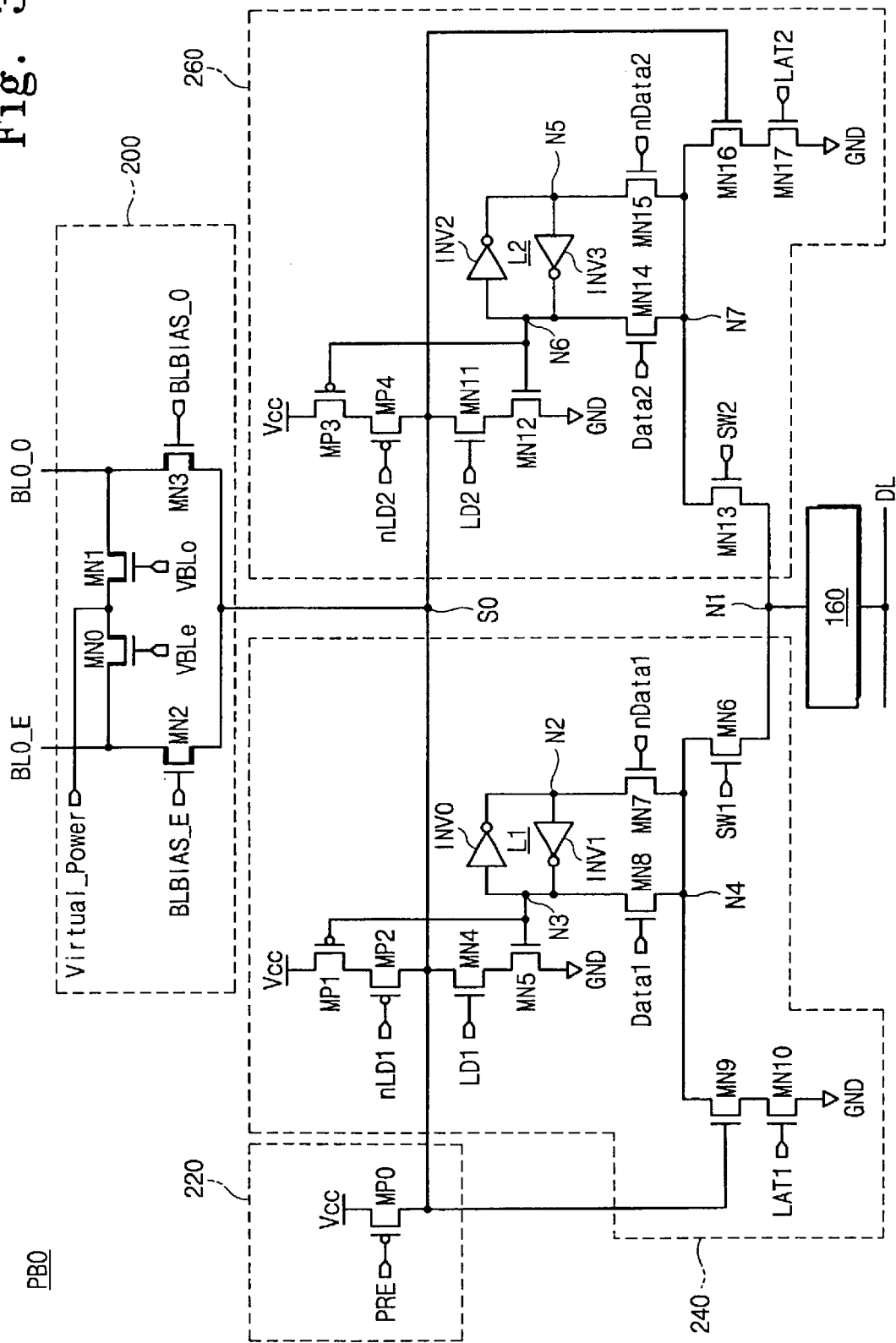
FIG. 3 is a circuit diagram of a page buffer for use in the flash memory device shown in FIG. 2.

Although a preferred embodiment of a page buffer PB0 coupled to a pair of bitlines (BL0_O, BL0_E) is illustrated in FIG. 3, page buffers corresponding to the other bitline pairs may have the same configuration.

Referring to FIG. 3, an example bitline select and bias block 200 includes four NMOS transistors MN0, MN1, MN2, and MN3. The NMOS transistors MN0 and MN1 are serially coupled between bitlines BL0_O and BL0_E, and are each controlled by their corresponding control signals VBLe and VBLo. Drains of the NMOS transistors MN0 and MN1 are commonly coupled to a signal line Virtual_Power. During a program/read operation, a ground voltage GND is applied to the signal line Virtual_Power. The NMOS transistor MN2 is coupled between the bitline BL0_E and a sense node SO and is controlled by a control signal BLBIAS_E. The NMOS transistor MN3 is coupled between the bitline BL0_O and the sense node SO and is controlled by a control signal BLBIAS_O. A precharge block 220 includes a PMOS transistor MP0, which is coupled between a power supply voltage Vcc and the sense node SO and is controlled by a control signal PRE.

A first sense and latch block 240 includes a latch L1, two PMOS transistors MP1 and MP2, and seven NMOS transistors MN4–MN10. The latch L1 has a first latch node N2 and a second latch node N3 and is formed by inverters INV0 and INV1. An input terminal of the inverter INV0 is coupled to the second latch node N3, and an output terminal thereof is coupled to the first latch node N2. An input terminal of the inverter INV1 is coupled to the first latch node N2, and an output terminal thereof is coupled to the second latch node N3. The PMOS transistors MP1 and MP2 are serially coupled between the power supply voltage Vcc and the sense node SO. The NMOS transistors MN4 and MN5 are serially coupled between the sense node SO and a ground voltage GND. The PMOS transistor MP1 and the NMOS transistor MN5 are turned on/off according to a logic state of the second latch node N3. The NMOS transistor MN4 is turned on/off by a control signal LD1, and the PMOS transistor MP2 is turned on/off by a signal nLD1 which is an inverted version of the control signal LD1. The NMOS transistor MN6 is coupled between an internal node N1 and a node N4, and is turned on/off by a logic state of a control signal SW1. The NMOS transistor MN7 is coupled between the first latch node N2 of the latch L1 and the node N4. The NMOS transistor MN8 is coupled between the second latch node N3 of the latch L1 and the node N4. The NMOS transistor MN8 is controlled according to a logic state of a control signal Data1, and the NMOS transistor MN7 is controlled according to a logic state of nData1, which is an inverted version of the control signal Data1. The NMOS transistors MN9 and MN10 are serially coupled between the node N4 and the ground voltage GND. A gate of the NMOS transistor MN9 is coupled to the sense node SO, and a gate of the NMOS transistor MN10 is coupled to a control signal LAT1.

In a data load period of a program operation, the logic state of the control signal Data1 is identical to that of data to be programmed. For example, if the data to be programmed is '1', the control signal Data 1 has a logic '1' state. If the data to be programmed is '0', the control signal Data1 has a logic '0' state. The control signal Data1 has the logic '1' state in discharge and data output periods of a read operation, and has the logic '0' state in a data latch period thereof. It is apparent to those skilled in the art that the logic state of the control signal Data1 is variable with design conditions.

In the first sense and latch block 240, the NMOS transistors MN6–MN10 constitute a first transfer circuit, and the PMOS and NMOS transistors MP1, MP2, MN4, and MN5 constitute a second transfer circuit. The first transfer circuit transfers data on a data bus DL to the latch L1 (i.e., the first latch node N2) during a program operation. The first transfer circuit transfers data of the sense node SO to the latch L1 during a read operation, and then transfers the latched data to the data bus DL via the column gate circuit 160. The second transfer circuit transfers data held at the latch L1 to the sense node SO during a program operation. These operations will be explained in detail later.

Still referring to FIG. 3, a second sense and latch block 260 includes a latch L2, two PMOS transistors MP3 and MP4, seven NMOS transistors MN1–MN17. The latch L2 has a first latch node N5 and a second latch node N6, and is formed by inverters INV2 and INV3. An input terminal of the inverter INV2 is coupled to the second latch node N6, and an output terminal thereof is coupled to the first latch node N5. An input terminal of the inverter INV3 is coupled to the first latch node N5, and an output terminal thereof is coupled to the second latch node N6. The PMOS transistors MP3 and MP4 are serially coupled between a power supply voltage Vcc and a sense node SO. The NMOS transistors MN11 and MN12 are serially coupled between the sense node SO and a ground voltage GND. Gates of the PMOS transistor MP3 and the NMOS transistor MN12 are commonly coupled to the second latch node N6. The NMOS transistor MN11 is turned on/off by a control signal LD2, and the PMOS transistor MP4 is turned on/off by an inverted version of the control signal LD2. The NMOS transistor MN13 is coupled between an internal node N1 and a node N7, and is turned on/off according to a logic state of a control signal SW2. The NMOS transistor MN14 is coupled between the second latch node N6 of the latch L2 and the node N7. The NMOS transistor MN15 is coupled between the first latch node N5 of the latch L2 and the node N7. The NMOS transistor MN14 is controlled according to a logic state of a control signal Data2, and the NMOS transistor MN15 is controlled according to a logic state of a signal nData2, which is an inverted version of the control signal Data2. The NMOS transistors MN16 and MN17 are serially coupled between the node N7 and the ground voltage GND. A gate of the NMOS transistor MN16 is coupled to the sense node SO, and a gate of the NMOS transistor MN17 is coupled to a control signal LAT2.

The logic state of the control signal Data2 is determined the same as the control signal Data1 and will not be described in further detail.

In the second sense and latch block 260, the NMOS transistors MN13–MN17 constitute a first transfer circuit. The PMOS transistors MP3, MP4, MP11, and MP12 constitute a second transfer circuit. The first transfer circuit transfers data on a data bus DL to the latch (i.e., the first latch node N5) during a program operation. The first transfer circuit transfers data of the sense node SO to the latch L2 during a read operation, and then transfers the latched data to the data bus DL via the column gate circuit 160. The second transfer circuit data held to the latch L2 to the sense node SO during a program operation. These operations will be explained in detail below.

Figure 4A:
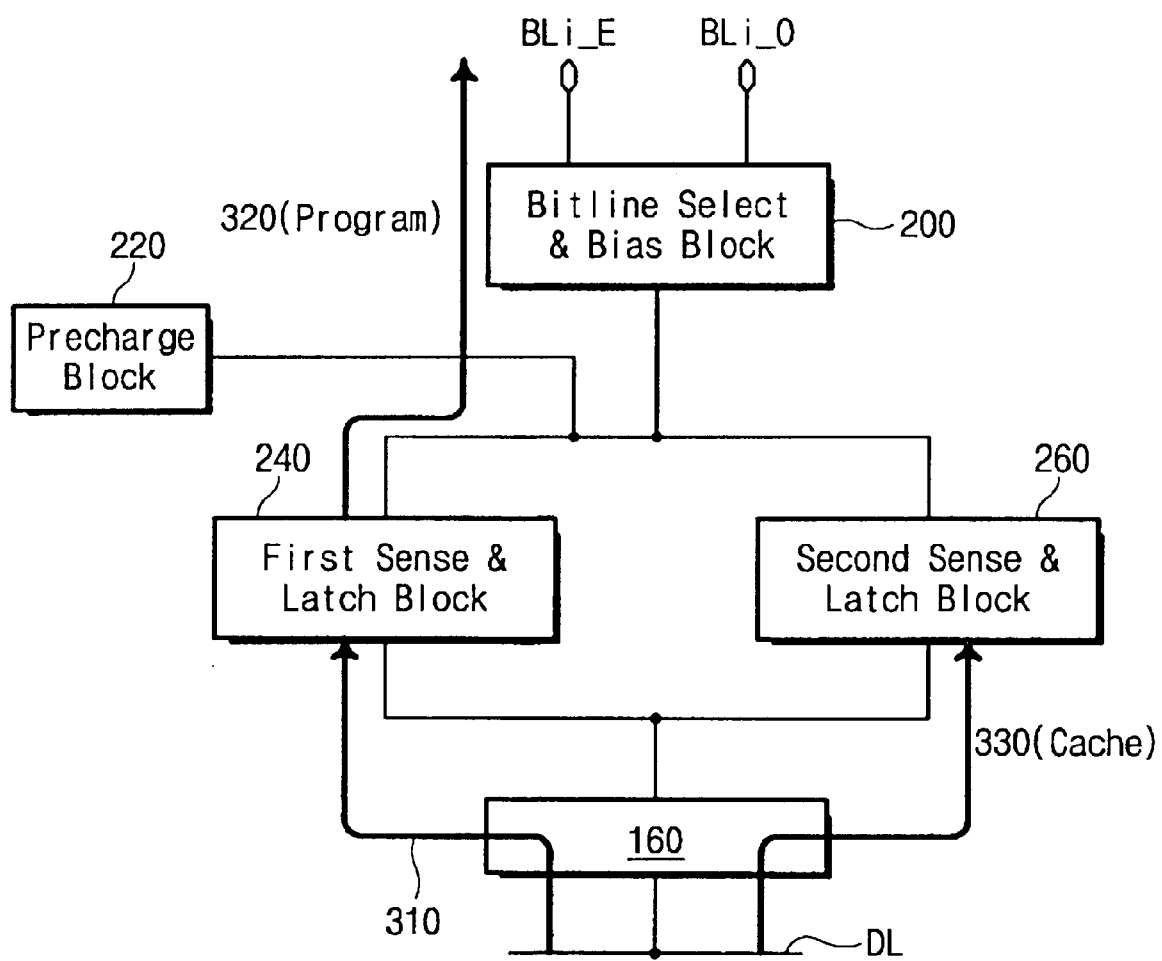
FIG. 4A is a data-flow diagram for explaining a cache function included in embodiments of the present invention during a program operation.

With reference to FIG. 4A, a cache function performed by embodiments of the invention is now described using a data-flow diagram. Data to be programmed is loaded to a first sense and latch block 240 (see "310"). The loaded data is programmed to a memory cell via a bitline BLi_E (see "320"). During the program operation, a second sense and latch block 260 carries out a cache function (see "330"). That is, the data transferred from the data bus DL via the column gate circuit 160 is latched to the second sense and latch block 260. Next, the data loaded to the second sense and latch block 260 is to be programmed to the memory cell via the bitline BLi_O. During the program operation, the first sense and latch block 240 carries out the cache function. That is, the data transferred from the data bus DL via the column gate circuit 160 is latched to the first sense and latch block 240. Except a time required for loading the first program data, a load time of the other program data overlaps with a time required for programming previously loaded data. Thus, the total program time can be reduced during successive program operations. Particularly, in a case where a page size is increased, a data load time occupies a sizable proportion of a program time of one cycle. Accordingly, the program time of one cycle must be increased, which means the reduction of a program speed. However, in case of the memory device having a cache function according to embodiments of the present invention, the total program time is almost unchanged even when the page size is increased. This is because a data load time and a program period overlap with each other.

Figure 4B:
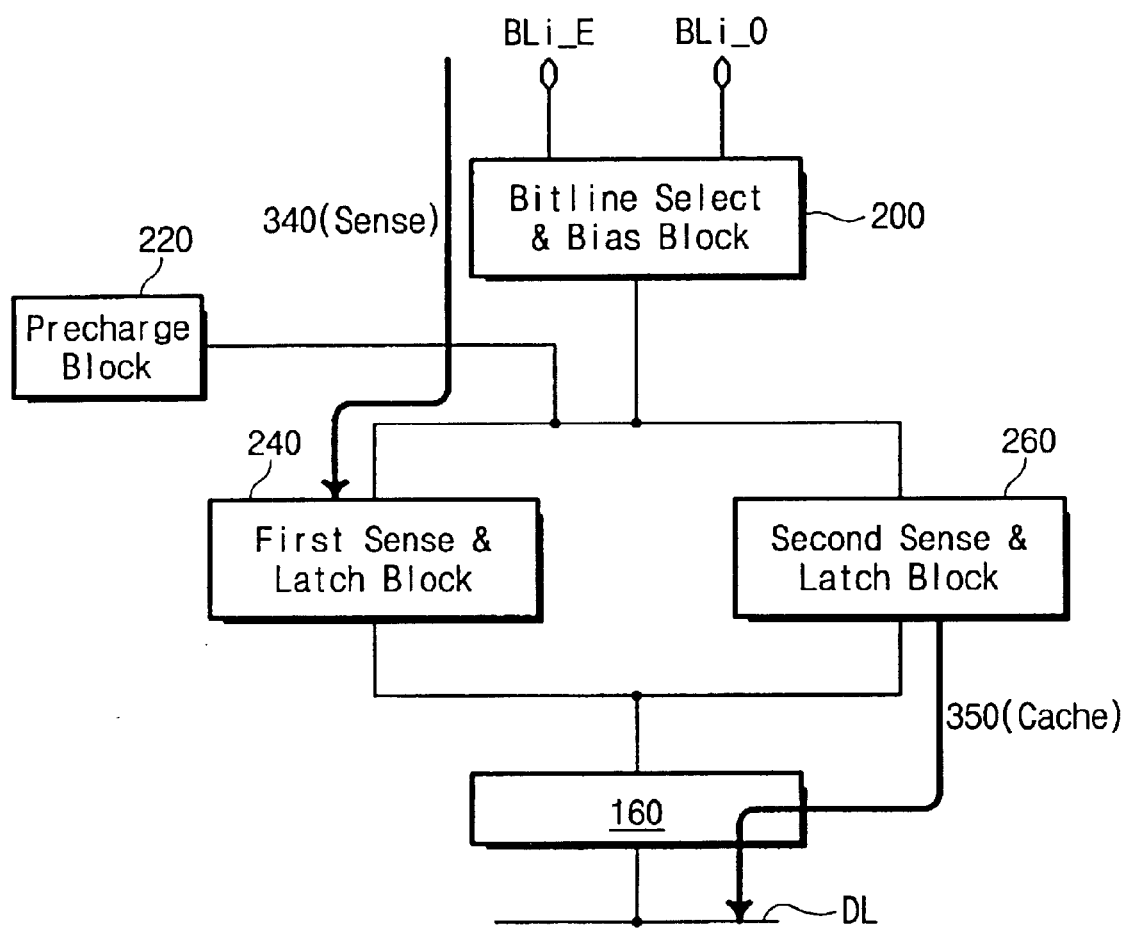
FIG. 4B is a data-flow diagram for explaining a cache function performed by embodiments of the present invention during a read operation.

With reference to FIG. 4B, a cache function of the invention is now described using a data-flow diagram. After setting a sense node SO and a bitline to a predetermined state through a bitline select and bias block 200 and the precharge block 220, a bitline select and bias block 260 senses data from a memory cell coupled to a selected bitline. Next, after setting the sense node SO and the bitline to a predetermined state through the bitline select and bias block 200 and a precharge block 220, the first sense and latch block 240 senses the data from the memory cell coupled to the selected bitline (see "340"). Simultaneously, the second sense and latch block 240 outputs data sensed to a data bus DL through a column gate electrode 160 (see "350").

While a sense operation is carried out through one of the sense and latch blocks 240 and 260, data latched (i.e., sensed) to the other sense and latch block is loaded on a data line. Such a cache function makes it possible to enhance a read operation speed of a flash memory device.

Figure 4C:
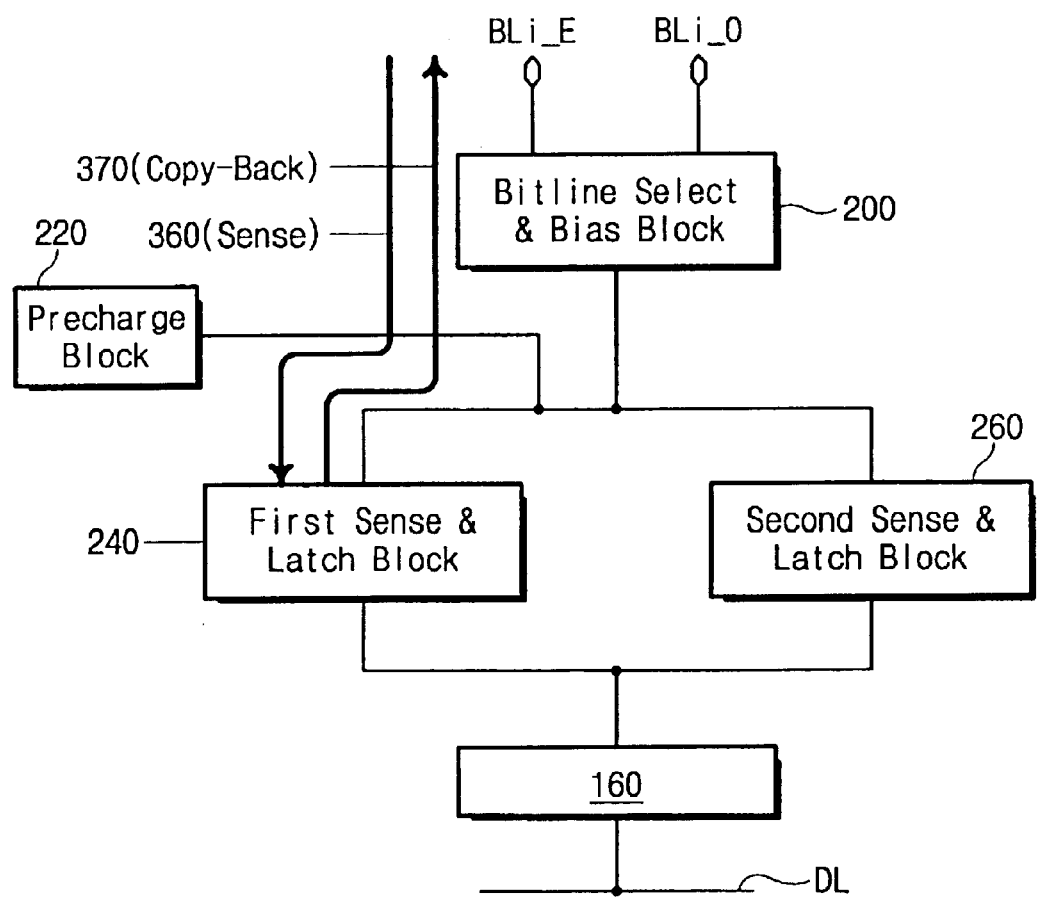
FIG. 4C is a data-flow diagram for explaining a page copy-back function performed by embodiments of the present invention.

With reference to FIG. 4C, a page copy-back operation that can be performed by embodiments of the invention is now described using a data-flow diagram. The page copy-back operation means a selected page is read out to latch page data (see "360") and the latched data is programmed to another page (see "370"). Since one sense and latch block can perform all the operations, other sense and latch blocks are inactivated during the page copy-back operation. Read and program operations are the same as previously described and will not be explained in further detail. According to the page copy-back operation, data read out from a first page is programmed to a second page in its entirety without inverting its logic state. Therefore, it is unnecessary to provide a separate page copy flag cell to memory cell arrays according to embodiments of the invention. This will be explained in detail below.

Figure 5:
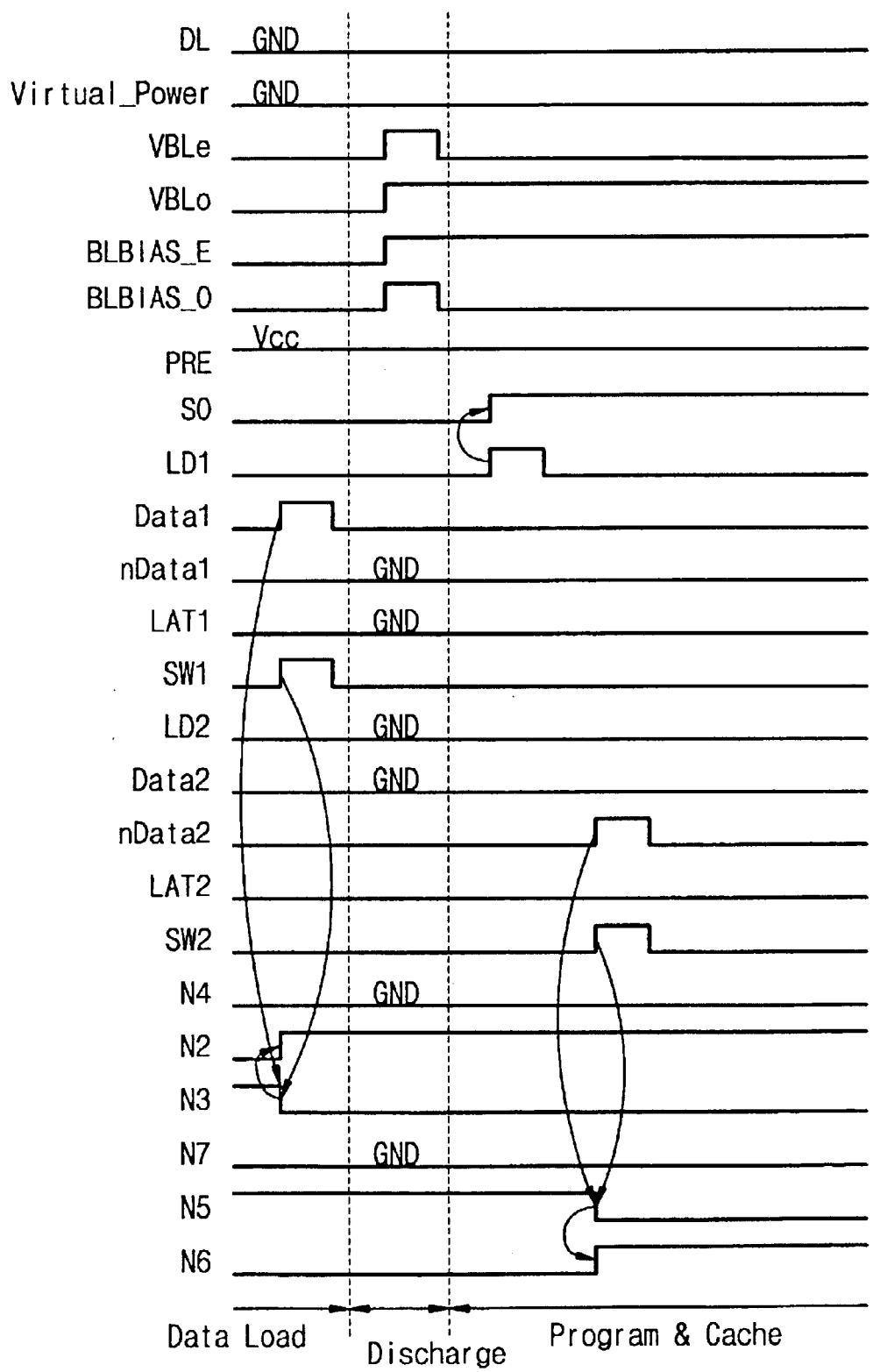
FIG. 5 is a timing diagram for explaining a program operation performed by embodiments of the present invention.

A program operation performed according to embodiments of the present invention is now described below with reference to FIG. 5 and FIG. 6. In order to simplify the description, the program operation is described using one page buffer. The program operation is divided into a data load period, a discharge period, and a program and cache period, as shown in FIG. 5.

In the data load period, data is transferred to one of first and second sense and latch blocks 240 and 260. For convenience, it is assumed that a first program data bit is loaded to a latch L1 of the first sense and latch block 240 and the first program data bit is '1'. Under this assumption, a control signal Data1 becomes high and a data line DL becomes inverted, i.e., low. As a control signal SWI transitions from a low level to a high level, a second latch node N3 of the latch L1 become low and a first latch node N2 becomes high, as shown in FIG. 5. As a result of these operations, the first program data bit is loaded to the first sense and latch block 240 via a data path 1 shown in FIG. 6.

Before programming the data loaded to the first sense and latch block 240, voltages of bitlines BL0_E and BL0_O and the sense node SO are discharged. This is achieved by applying a ground voltage GND to a signal line Virtual_Power and making control signal VBLe, VBLo, BLBIAS_E, and BLBIAS_O become high. Components (e.g., PMOS transistor MP0), which may affect the voltage of the sense node SO, are kept in a non-conductive state.

When a discharge operation is completed, the control signals VBLe and BLBIAS_O transition from a high level to a low level. Thus, the bitline BL0_E is coupled to the sense node SO via an NMOS transistor MN2, while the bitline BL0_O is coupled to the signal line Virtual_Power of the ground voltage GND via an NMOS transistor MN1. As shown in FIG. 5, control signal LD1 transitions from a low level to a high level, which allows a PMOS transistor MP2 and an NMOS transistor MN4 to be turned on. Since the data '1' is loaded to the latch L1, a second latch node N3 is kept low. The PMOS transistor MP2 is turned on to pull up the sense node SO and the bitline BL0_E to a power supply voltage Vcc along a data path 2 shown in FIG. 6, i.e., through the PMOS transistors MP1 and MP2. Afterwards, the data transferred to the sense node SO is to be programmed to a corresponding memory cell by means of a conventional manner.

Figure 6:
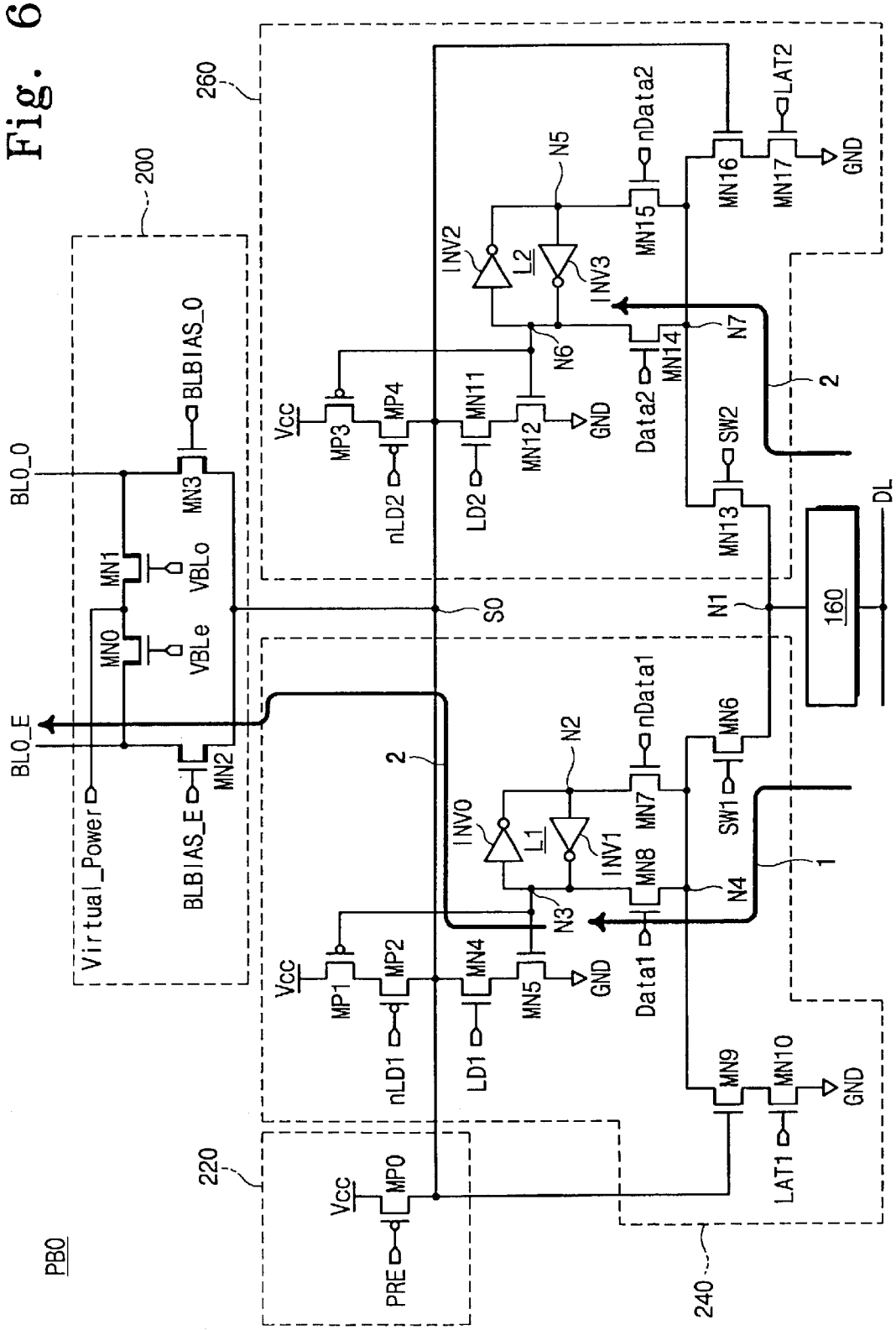
FIG. 6 is a circuit diagram of a data flow of a page buffer according to a program operation performed by embodiments of the present invention.

During a practical program operation, a cache operation of the second sense and latch block 260 according to the invention is concurrently performed through the data path 2 shown in FIG. 6. Assuming that a data bit to be programmed is '1', a data line DL becomes high and a control signal Data2 becomes low. During the program operation, as a control signal SW2 transitions from a low level to a high level, a first latch node N5 of the latch L2 becomes low via the NMOS transistor MN15 and a second latch node N6 becomes high, as shown in FIG. 5. As a result of these operations, a second program data bit is loaded to the second sense and latch block 260 through the data path 2 shown in FIG. 6 while the first program data is stored in a memory cell. Programming the loaded data to the second sense and latch block 260 is performed by the same manner as previously described and will not be explained in further detail.

While programming data loaded to the first/second sense and latch block, data is loaded to the second/first sense and latch node which eliminates a data load time from the total program time, except for the first data load time. Therefore, the overall program time of a flash memory device is reduced.

Figure 7:
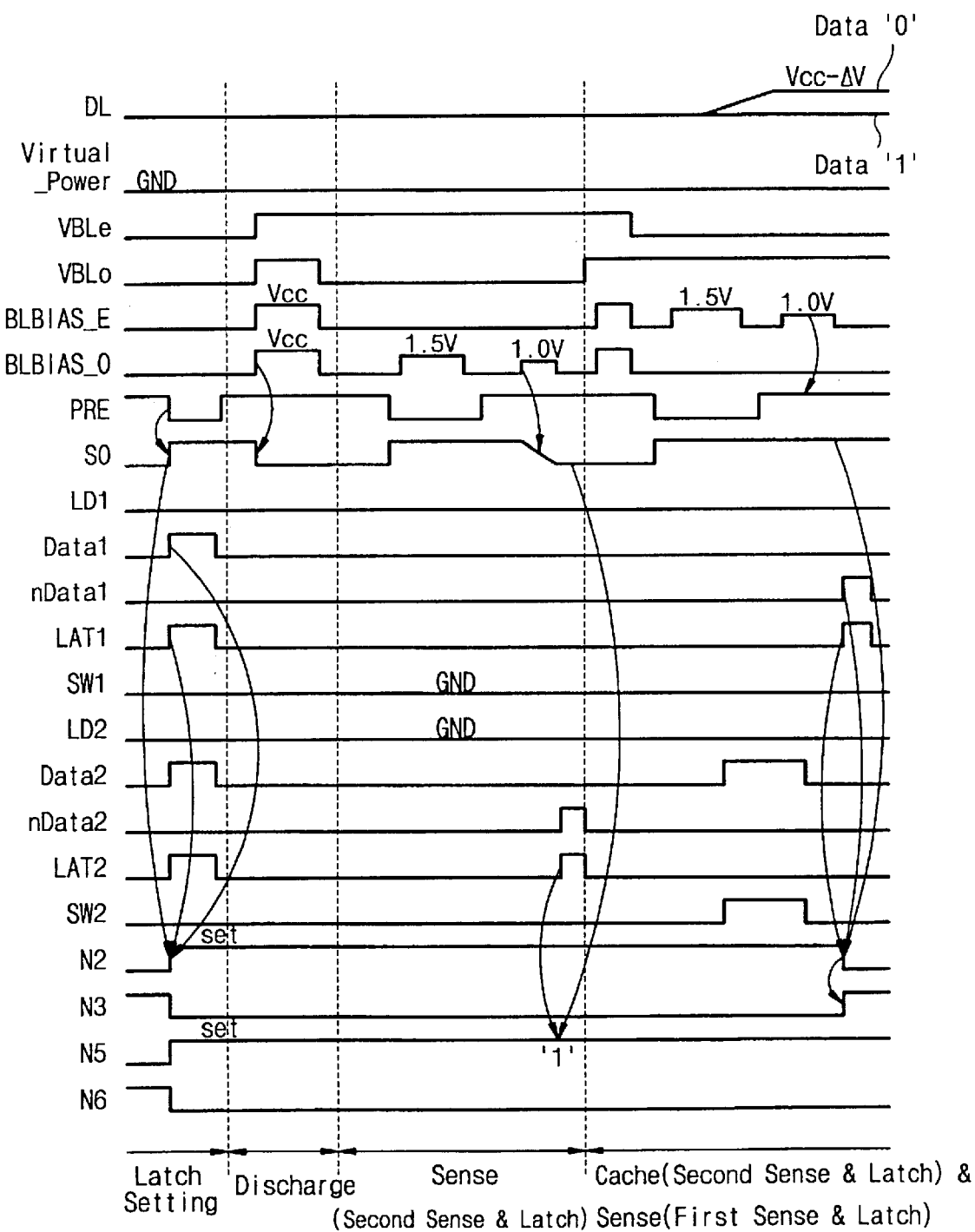
FIG. 7 is a timing diagram for explaining a read operation according to embodiments of the present invention.
Figure 8:
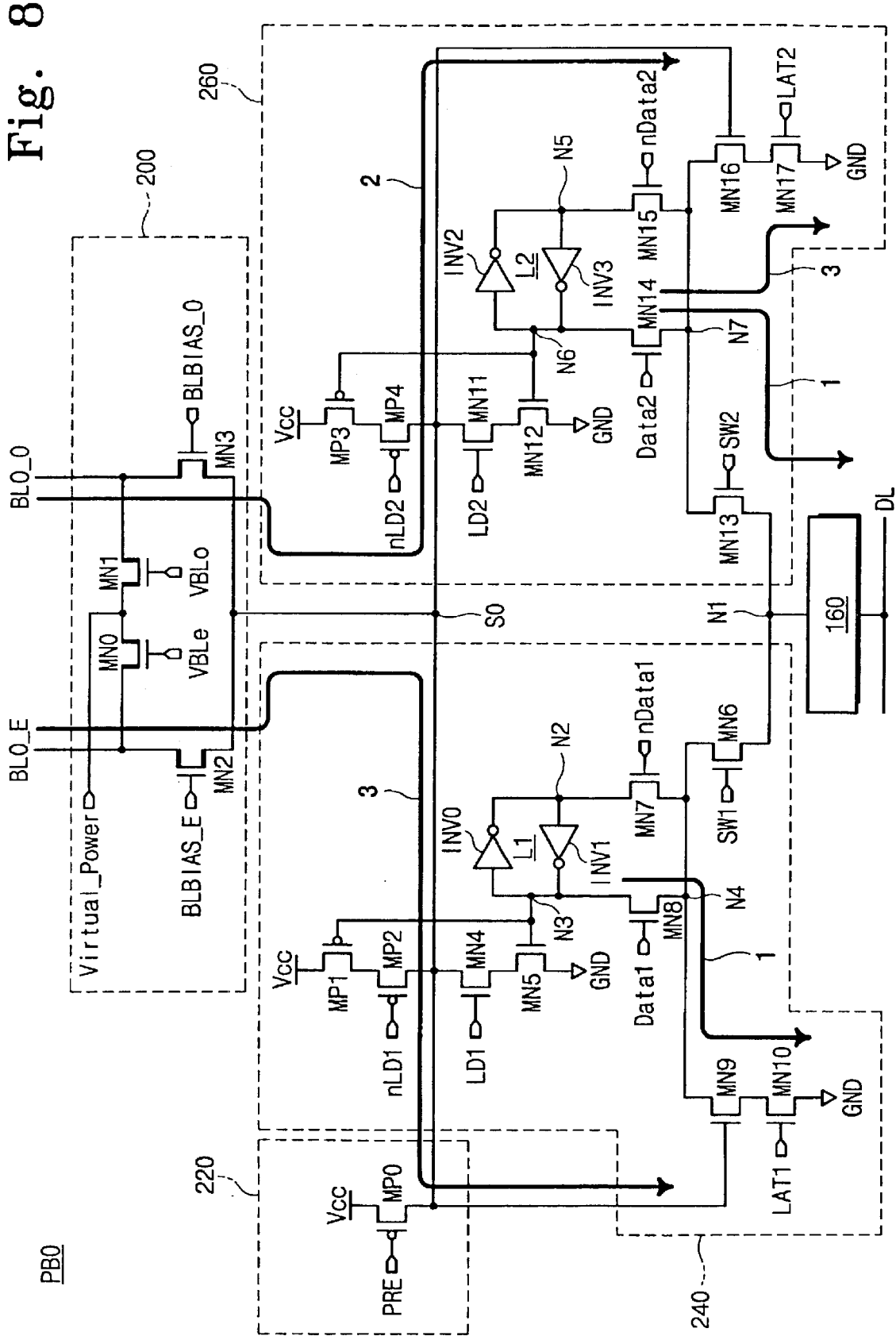
FIG. 8 is a circuit diagram of a data flow of a page buffer according to a read operation performed by embodiments of the present invention.

A read operation performed by embodiments of the invention is now described more fully with reference to FIG. 7 and FIG. 8. For the convenience, the read operation is described using one page buffer. Prior to description of the read operation, it is assumed that a memory cell coupled to the bitline BL0_O stores data '1' and a memory cell coupled to the bitline BL0_E stores data '0'.

The latches L1 and L2 in the first and second sense and latch blocks 240 and 260 are initialized to have a high level. This is achieved by a procedure as follows. As a control signal PRE transitions from a high level to a low level, the sense node SO is charged to a power supply voltage Vcc, which allows an NMOS transistor MN9 to be turned on. Simultaneously, control signals LAT1, LAT2, Data1, and Data2 transition from a low level to a high level, as shown in FIG. 7. NMOS transistors MN8, MN9, and MN10 of the first sense and latch block 240 are turned on, and an NMOS transistor MN7 thereof is turned off. As a result, a second latch node N3 of the latch L1 is grounded. That is, a first latch node N2 is set to data '1' through a data path 1 shown in FIG. 8. Similarly, NMOS transistors MN14, MN16, and MN17 of the second sense and latch block 260 are turned on, and an NMOS transistor MN15 thereof is turned off. As a result, a second latch node N6 of the latch L2 of the second sense and latch block 260 is grounded. That is, a first latch node N5 of the second sense and latch block 260 is set to data '1' through the data path 1 shown in FIG. 8.

If the latches L1 and L2 are set to data '1', a sense operation is to be carried out through one of the first and second sense and latch blocks 240 and 260. It is assumed that a sense operation is carried out through the second sense and latch block 260.

To discharge the sense node SO and the bitline BL0_E and BL0_O, each of the control signals VBLe, VBLo, BLBIAS_E, and BLBIAS_O transitions from a low level to a high level, as shown in FIG. 7. In this case, a ground voltage GND is applied to the signal line Virtual_Power, so that the sense node SO and the bitlines BL0_E and BL0_O have the ground voltage.

When the discharge operation is completed, each of the control signals VBLo, BLBIAS_E, and BLBIAS_O becomes low. Thus, the sense node SO and the bitline BL0_O become floating. The bitline BL0_E is electrically connected to the signal line Virtual_Power of the ground voltage GND via an NMOS transistor MN0, and the bitline BL0_O is electrically connected to the sense node SO. As a control signal PRE transitions from a high level to a low level, the sense node SO is discharged to the power supply voltage Vcc. A specific voltage (e.g., 1.5V), which is lower than the power supply voltage Vcc, is applied to the control signal line BLBIAS_O. The bitline BL0_O is charged to a voltage 1.5V-Vtn (Vtn being a threshold voltage of the NMOS transistor MN3) via the NMOS transistor MN3. In this case, an NMOS transistor MN2 is kept in a turn-off state. Afterwards, the control signals BLBIAS_O and BLBIAS_E become low and high, respectively.

In a case where the memory cell coupled to the bitline BL0_O is an ON cell (i.e., stores data '1'), a voltage of the bitline BL0_O is to be lowered toward a ground voltage GND. If a specific voltage (e.g., 1.0V) is applied to the control signal BLBIAS_O, the NMOS transistor MN3 is turned on and a voltage of the sense node SO is discharged to the ground voltage GND via the memory cell. This allows the NMOS transistor MN16 to be turned off. Data on the sense node SO is then latched by the second sense and latch block 260. More specifically, as previously mentioned, the sense node SO has a ground voltage GND. Therefore, a first latch node N5 of the second sense and latch block 260 is kept in the initially set data '1' even when control signals LAT2 and nDATA2 transition from a low level to a high level. The foregoing sense operation is performed through the data path 2 shown in FIG. 8.

When the sense operation for the bitline BL0_O is completed, a sense operation for the bitline BL0_E is to be performed as follows. To discharge the sense node SO and the bitline BL0_E, the control signal VBLe is kept high and the control signal VBLo transition from a low level to a high level, as shown in FIG. 7. Because the ground voltage is applied to the signal line Virtual_Power, the voltages of the bitline BL0_E and the sense node SO are discharged.

When the discharge operation is completed, the sense node SO is kept floating. Thereafter, as the control signal PRE transitions from a high level to a low level, the sense node SO is precharged to a power supply voltage Vcc. A specific voltage (e.g., 1.5V), which is lower than the power supply voltage Vcc, is applied to the control signal line BLBIAS_E. As a result, the bitline BL0_E is charged to a voltage 1.5V-Vtn (Vtn being a threshold voltage of the NMOS transistor MN2) through the NMOS transistor MN2. That is, the bitline BL0_E and the sense node SO are electrically connected to each other. In this case, the NMOS transistor MN3 is kept in a turn-off state. Thereafter, as shown in FIG. 7, the control signals BLBIAS_E and PRE become low and high, respectively.

In a case where the memory cell coupled to the bitline BL0_E is an OFF cell (i.e., it stores data '0'), the voltage 1.5V-Vtn of the bitline BL0_E is kept. A specific voltage (e.g., 1.0V) is applied to a control signal line BLBIAS_O such that the bitline BL0_E and the sense node SO are electrically connected to each other. This allows the NMOS transistor MN3 to be turned on. The voltage of the sense node SO is continuously kept in the power supply voltage Vcc, which means the NMOS transistor MN9 is turned on. The data on the sense node SO is then latched by the first sense and latch block 240. That is, when the control signals LAT1 and nddata1 transition from a low level to a high level, the data '0' is latched to the first latch node N5 of the first sense and latch block 240.

While the sense operation is performed through the first sense and latch block 240 (in FIG. 8, it is performed through a data path 3), the data stored in the second sense and latch block 260 is transferred to the data line DL through the data path 1 shown in FIG. 8. More specifically, the data line DL is discharged to a ground voltage GND and is kept in a floating state. Afterwards, control signals Data2 and SW2 transition from a low level to a high level, as shown in FIG. 7. This allows the second latch node N6 to be electrically connected to the data line DL via the NMOS transistors MN14 and MN13 and the column gate circuit 160. Since the second latch node N6 has the ground voltage GND, a voltage of the data line DL is to be kept in the ground voltage GND. If the second latch node N6 has a power supply voltage Vcc, the voltage of the data line DL is increased from the ground voltage GND. As a result, the data line DL has a voltage Vcc-ΔV (0<ΔV<Vcc) by virtue of charge sharing. A subsequent data output procedure is apparent to those skilled in the art and will not be explained in further detail.

In a case where many pages of data are accessed, a sense operation is carried out via one sense and latch block and a cache function is done via another sense and latch block. Thus, a read speed of the flash memory device according to embodiments of the invention is considerably enhanced.

Figure 9:
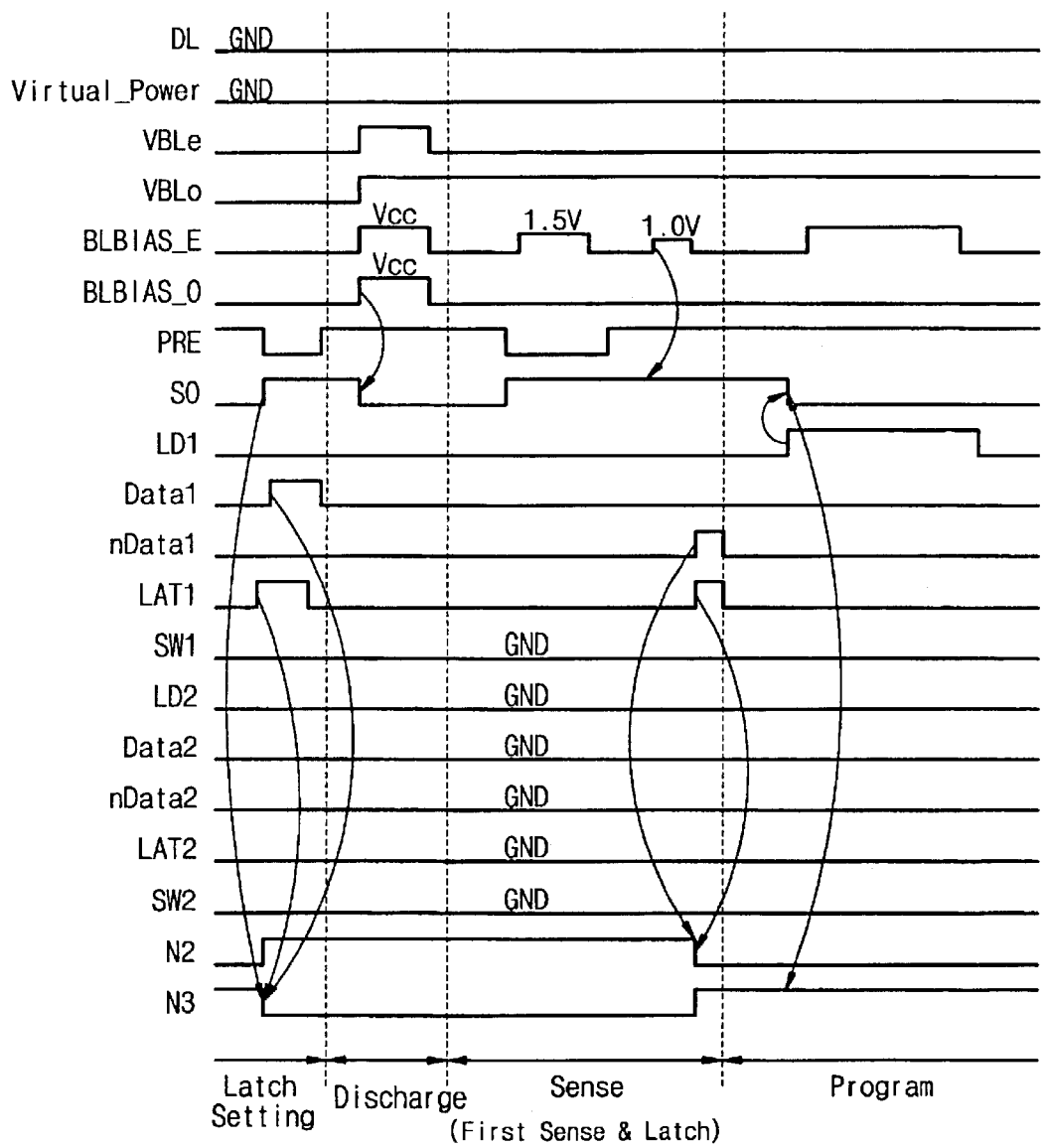
FIG. 9 is a timing diagram for explaining a page copy-back operation performed by embodiments of the present invention.
Figure 10:
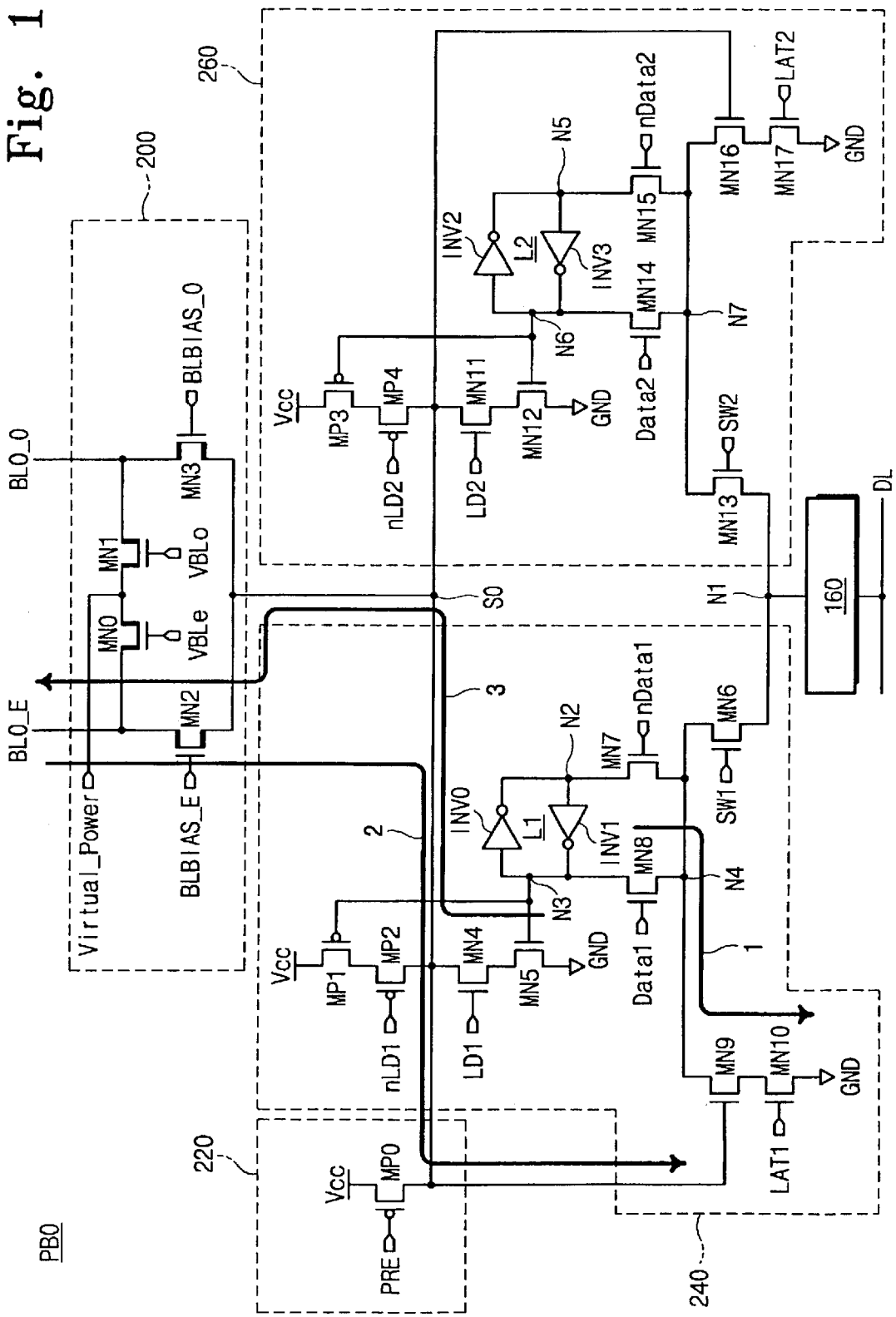
FIG. 10 is a circuit diagram of a data flow of a page buffer according to a page copy-back operation performed by embodiments of the present invention.

With reference to FIG. 9 and FIG. 10, a page copy-back operation is now explained in detail. For the convenience, the page copy-back operation is described using one page buffer. The page copy-back operation is divided into a sense operation and a program operation. Prior to description of the page copy-back operation, assume that a memory cell coupled to a bitline BL0_E is selected and the selected memory cell stores data '1', The page copy-back operation can be carried out using either the first or second sense and latch blocks of a page buffer. Therefore, the other sense and latch block is kept in an inactive state during the page copy-back operation. With reference to FIGS. 9 and 10, the page copy-back operation is described through a first sense and latch block 240.

A latch L1 in the first sense and latch block 240 is initialized to have a high level. That is, a control signal PRE transitions from a high level to a low level such that a sense node SO is charged up to a power supply voltage Vcc. This allows an NMOS transistor MN9 to be turned on. Simultaneously, control signals LAT1 and Data2 transition from a low level to a high level, as shown in FIG. 9. As a result, a second latch node N3 of a latch L1 is grounded. That is, a first latch node N2 is set to data '1' through a data path 1 shown in FIG. 10. Although not shown in the figure, an operation for setting a latch of the second sense and latch block 260 may be concurrent with an operation for setting a latch of the first sense and latch block 240.

Afterwards, if the latch L1 of the first sense and latch block 240 is set to data '1', a sense operation is to be performed through the first sense and latch block 240. To discharge the sense node SO and the bitlines BL0_E and BL0, each of the control signals VBLe, VBLo, BLBIAS_E, and BLBIAS_O transitions from a low level to a high level, as shown in FIG. 9. In this case, a ground voltage GND is applied to a signal line Virtual_Power, so that the sense node SO and the bitline BL0_E and BL0_O have a ground voltage.

When the discharge operation is completed, each of the control signals VBLe, BLBIAS_E, and BLBIAS_O becomes low to float the sense node SO and the bitline BL0_E. The bitline BL0_O is electrically connected to the signal line Virtual_Power of the ground line GND via the NMOS transistor MN1. As the control signal PRE transitions from a high level to a low level, the sense node SO is precharged to a power supply voltage Vcc. A specific voltage (e.g., 1.5V), which is lower than the power supply voltage Vcc, is applied to the control signal line BLBIAS_E. Thus, the bitline BL0_E is charged to a voltage 1.5V-Vtn via the NMOS transistor MN2. In this case, the NMOS transistor MN3 is kept in a turn-off state. As shown in FIG. 9, the control signals BLBIAS_E and PRE become low and high, respectively.

In a case where the memory cell coupled to the bitline BL0_E is an OFF cell (i.e., it stores data '0'), a voltage of the bitline BL0_E is kept in the above state. If a specific voltage (e.g., 1.0V) is applied to the control signal line BLBIAS_E, the NMOS transistor MN2 is turned on. Further, a voltage of the sense node SO is kept in the power supply voltage Vcc because there is no discharge path. This allows the NMOS transistor MN9 to be turned off. The data on the sense node SO is then latched by the first sense and lath block 240. That is, when the control signals LAT1 and nData1 transition from a low level to a high level, the first latch node N2 of the first sense and latch block 240 is grounded via the NMOS transistors MN7, MN9, and MN10. This is because the sense node SO has the power supply voltage Vcc. The foregoing sense operation is carried out through the data path 2 shown in FIG. 10.

When the foregoing sense operation is completed, the data stored in the latch L1 is copied (or programmed) to a memory cell of another page. The voltages of the sense SO and the bitline BL0_E are fully discharged to the signal line Virtual_Power via the NMOS transistors MN0 and MN2. Components (e.g., the PMOS transistor MP0), which may affect the voltage of the sense node SO, are kept in an inactive state.

When the discharge operation is completed, the data stored in the latch L1 is transferred to the sense node SO. This is achieved by making the control signal LD1 transition from a low level to a high level. Since a value of the data stored in the latch L1 is '0', a second latch node N3 has the power supply voltage Vcc. As an NMOS transistor MN5 is turned on and a PMOS transistor MP1 is turned off, the sense node SO has the ground voltage GND. Thereafter, the data on the sense node SO is to be programmed to memory cells of a previously selected page and another page by way of a conventional manner.

As described above, in a case where data '0' is sensed, a data flow of a memory cell, a sense node SO, a first latch node N2, a second latch node N3, and the sense node SO is '0'→'1'→'0'→'1'→'0'. Namely, at the time when the page copy-back operation is completed, it can be found that an initially stored value is stored a memory cell without inversion thereof. As a result, there is no need for a separate page copy flag cell to store whether page data is inverted.

In summary, the flash memory device according to embodiments of the invention supports a program/read cache function by constructing a page buffer with two sense and latch blocks. Based on the program cache function, when program operations are successively performed, a time for loading page data is not separately required, except for first page data. Thus, the total program time can be shortened. Based on the read cache function, when program operations are successively performed, there is not needed a time required for outputting page data except first page data. Based on the page copy-back operation according to embodiments of the invention, there is no need for a page copy flag cell to store whether copied page data is inverted. Thus, a reliability-failing cause can be eradicated. Particular embodiments of the invention will now be discussed.

One embodiment of the present invention relates to a NAND-type flash memory device including a memory cell array and a register. The memory cell array has a plurality of wordlines, at least two bitlines, and a plurality of memory cells each being arranged at intersections of the wordlines and the bitlines. The register is coupled to the internal node and has first and second sense and latch blocks commonly coupled to an internal node. The internal node is electrically connected to a data bus via the internal node. The first and second sense and latch blocks can independently and exclusively perform a read/program operation for corresponding bitlines. While data is sensed from a memory cell by one of the first sense and latch block, data is transferred to the data bus from the other sense and latch block. Further, while data is programmed to the memory cell by one of the first sense and latch block, data to be programmed is transferred to the other sense and latch block from the data bus.

In the embodiment, the register further includes a sense node, a precharge block for charging the sense node in response to a precharge control signal, and a bitline select and bias block for selecting one of the bitlines in response to a plurality of bitline control signals to selectively couple the selected bitline to the sense node.

In the embodiment, each of the first and second sense and latch blocks includes a latch, a first transfer circuit, and a second transfer circuit. The latch holds data and has a first latch node and a second latch node. The first transfer circuit is coupled to the first and second latch nodes, the sense node, and the internal node and transfers data on the data bus to the first latch during a program operation. The second transfer circuit is coupled between the second latch node and the sense node and transfers data held in the latch to the sense node. The first latch node has data transferred from the data bus during the program operation. The second transfer circuit pulls up/down the sense node depending on a logic state of the second latch node.

In the embodiment, the first transfer circuit transfers the data on the sense node to the first latch during the read operation, and transfers the data in the latch to the data bus via the switch circuit.

In the embodiment, the second transfer circuit includes first and second pull-up transistors and first and second pull-down transistors. The first and second pull-up transistors are serially coupled between a power supply voltage and the sense node. The first and second pull-down transistors are serially coupled between the sense node and a ground voltage. The first pull-up transistor and the second pull-down transistor are switched depending on a logic state of the second latch node. The second pull-up transistor is switched according to a load control signal, and the first pull-up transistor is switched according to an inverted version of the load control signal.

The NAND-type flash memory device carries out a page copy-back operation without a separate page copy flag cell for storing information to detect whether copied page data is inverted. When the page copy-back operation is carried out, the data on the sense node is transferred to the latch via the first transfer circuit of one of the first and second sense and latch blocks. Thereafter, the data held in the latch is transferred to the sense node via the second transfer circuit. When one of the first and second sense and latch blocks carries out the page copy-back operation, the other sense and latch block becomes inactive.

Another embodiment of the invention relates to read and program methods of a non-volatile memory device comprising a memory cell array including a plurality of cell strings each being electrically connected to corresponding their bitlines, wherein among the corresponding bitlines, two adjacent bitlines constitute a bitline pair; a plurality of unit page buffers each being coupled to the bitline pairs; and a column gate circuit for selecting at least one of the unit page buffers to couple the selected unit page buffer to a data bus. In the program method, data is loaded to a first sense and latch block of the selected unit page buffer. Using the data in the first sense and latch block, a first program operation is carried out and data is concurrently loaded to a second sense and latch block of the selected unit page buffer. Likewise, when a second program operation is carried out using the data in the second sense and latch block, data is loaded to the first sense and latch block.

In the read operation, data is sensed from the memory cell array via one of a pair of bitlines corresponding to the selected unit page buffer. The sensed data is latched to a first sense and latch block of the selected unit page buffer. Next, the data in the first sense and latch block is outputted to the exterior and data is concurrently sensed from the memory cell array via the other bitline corresponding to the selected unit page buffer. The sensed data is latched to a second sense and latch block of the selected unit page buffer. These operations are repeated unit page data is all outputted to the exterior.

It will be understood by those skilled in the art that various modifications and changes may be made to the present invention without departing from the scope thereof, which is defined by the appended claims.

What is claimed is:

1. A semiconductor memory device comprising:
   an array including a plurality of wordlines, at least two bitlines, and a plurality of memory cells each being arranged at intersections of the wordlines and the bitlines;
   a register including first and second sense and latch blocks commonly coupled to an internal node; and
   a data bus coupled to the internal node;
   wherein the first and second sense and latch blocks are structured to independently and exclusively perform a read/program operation for corresponding bitlines; and
   wherein the memory device is structured to sense/program data from/to a memory cell by the first sense and latch block while data is loaded/outputted to/from the second sense and latch block from/to the data bus.

2. The semiconductor memory device of claim 1, wherein the register includes:
   a sense node;
   a precharge block for charging the sense node in response to a precharge control signal; and
   a bitline select and bias block for selecting one of the bitlines in response to a plurality of bitline control signals to selectively couple the selected bitline to the sense node.

3. The semiconductor memory device of claim 1, wherein the first sense and latch block includes:
   a first latch for holding data, the first latch having a first latch node and a second latch node,
   a first transfer circuit for transferring data on the data bus to the first latch during a program operation, the first transfer circuit being coupled to the first and second latch nodes, the sense node, and the internal node, and
   a second transfer circuit for transferring data held in the latch to the sense node, the second transfer circuit being coupled between the second latch node and the sense node;
   wherein the first latch node is structured data transferred to it from the data bus during the program operation; and
   wherein the second transfer circuit pulls up/down the sense node depending on a logic state of the second latch node.

4. The semiconductor memory device of claim 3, wherein the first transfer circuit is structured to transfer the data on the sense node to the first latch during the read operation, and structured to transfer the data in the latch to the data bus via the switch circuit.

5. The semiconductor memory device of claim 3, wherein the first transfer circuit includes:
   a first transistor having a source coupled to the internal node, a gate coupled to a first control signal, and a drain;
   a second transistor having a source coupled to the drain of the first transistor, a drain coupled to the first latch node, and a gate coupled to a second control signal;
   a third transistor having a source coupled to the drain of the first transistor, a drain coupled to the second latch node, and a gate coupled to a third control signal;
   a fourth transistor having a drain coupled to the drain of the first transistor, a gate coupled to the sense node, and a source; and
   a fifth transistor having a drain coupled to the source of the fourth transistor, a source coupled to a ground voltage, and a gate coupled to a fourth control signal.

6. The semiconductor memory device of claim 5, wherein the first, second, third, fourth, and fifth transistors comprise NMOS transistors.

7. The semiconductor memory device of claim 5, wherein the second and third control signals are complementary signals.

8. The semiconductor memory device of claim 5, wherein logic states of the second and third control signals are determined depending on data to be programmed during the program operation.

9. The semiconductor memory device of claim 5, wherein the second control signal is activated when the data on the sense node is transferred to the latch, and the third control signal is activated when the latch is set to a predetermined state and the data in the latch is transferred to the data bus.

10. The semiconductor memory device of claim 3, wherein the second transfer circuit includes first and second pull-up transistors serially coupled between a power supply voltage and the sense node and first and second pull-down transistors serially coupled between the sense node and a ground voltage; and wherein the first pull-up transistor and the second pull-down transistor are switched according to a logic state of the second latch node, the second pull-up transistor is switched according to a load control signal, and the first pull-up transistor is switched according to an inverted version of the load control signal.

11. The semiconductor memory device of claim 3, wherein the second sense and latch block includes:

a second latch for holding data, the second latch having a third latch node and a fourth latch node;

a third transfer circuit for transferring data on the data bus to the second latch during a program operation, the third transfer circuit being coupled to third and fourth latch nodes, the sense node, and the internal node; and a fourth transfer circuit for transferring data held in the latch to the sense node during the program operation, the fourth transfer circuit being coupled between the fourth latch node and the sense node;

wherein the third latch node is structured to have data transferred from the data bus during the program operation, and the fourth transfer circuit is structured to pull up/down the sense node depending on a logic state of the second latch node.

12. The semiconductor memory device of claim 11, wherein the fourth transfer circuit is structured to transfer the data on the data bus to the second latch during the read operation, and is structured to transfer the data in the latch to the data bus via the switch circuit.

13. The semiconductor memory device of claim 3, wherein the third transfer circuit includes:

a first transistor having a source coupled to the internal node, a gate coupled to a first control signal, and a drain;

a second transistor having a source coupled to the drain of the first transistor, a drain coupled to the third latch node, and a gate coupled to a second control signal;

a third transistor having a source coupled to the drain of the first transistor, a drain coupled to the fourth latch node, and a gate coupled to a third control signal;

a fourth transistor having a drain coupled to the drain of the first transistor, a gate coupled to the sense node, and a source; and a fifth transistor having a drain coupled to the source of the fourth transistor, a source coupled to a ground voltage, and a gate coupled to a fourth control signal.

14. The semiconductor memory device of claim 13, wherein the first, second, third fourth and fifth transistors are NMOS transistors.

15. The semiconductor memory device of claim 13, wherein the second and third control signals are complementary signals.

16. The semiconductor memory device of claim 13, wherein logic states of the second and third control signals are determined depending on data to be programmed during the program operation.

17. The semiconductor memory device of claim 13, wherein the second control signal is structured to be activated when the data on the data bus is transferred to the latch, and the third control signal is structured to be activated when the latch is set to a predetermined logic state and the data in the latch is transferred to the data bus.

18. The semiconductor memory device of claim 11, wherein the fourth transfer circuit includes first and second pull-up transistors serially coupled between a power supply voltage and the sense node and first and second pull-down transistors serially coupled between the sense node and a ground voltage; and wherein the first pull-up transistor and the second pull-down transistor are switched according to a logic state of the fourth latch node, the second pull-up transistor is switched according to a load control signal, and the first pull-up transistor is switched according to an inverted version of the load control signal.

19. The semiconductor memory device of claim 11, structured such that when a page copy-back operation is carried out, data on the sense node is transferred to a corresponding latch via one of the transfer circuits of either one of the first and second sense and latch blocks, and then the data held in the corresponding latch is transferred to the sense node via another transfer circuit.

20. The semiconductor memory device of claim 19, wherein when either one of the first and second sense and latch block carries out the page copy-back operation, the other sense and latch block becomes inactive.

21. A non-volatile semiconductor memory device comprising:

a memory cell array including a plurality of cell strings each being electrically connected to corresponding their bitlines, wherein among the corresponding bitlines, two adjacent bitlines constitute a bitline pair;

a plurality of unit page buffers each being coupled to the bitline pairs; and a column gate circuit for selecting at least one of the unit page buffers to couple the selected unit page buffer to a data bus, wherein each of the unit page buffers includes:

a sense node, an internal node coupled to the data bus via the column gate circuit, a bitline select and bias block for selecting one of bitlines of a corresponding pair to couple the selected bitline to the sense node, a precharge block for charging the sense node in response to a precharge control signal, a first sense and latch block coupled between the sense node and the internal node, and a second sense and latch block coupled between the sense node and the internal node, wherein the first and second sense and latch blocks are structured to independently and exclusively perform a read/program operation for bitlines of a corresponding pair; and wherein, while one of the first and second sense and latch blocks senses/programs data from/to a memory cell, data is loaded/outputted to/from the other sense and latch block via the switch circuit.

22. The non-volatile semiconductor memory device of claim 21, wherein each of the first and second sense and includes:

a latch for holding data, the latch having a first latch node and a second latch node;

a first transfer circuit for transferring data on the data bus to the latch during a program operation, the first transfer circuit being coupled to the first and second latch nodes, the sense node, and the internal node; and a second transfer circuit for transferring data held in the latch to the sense node, the second transfer circuit being coupled between the second latch node and the sense node, wherein the first latch node is structured to have data transferred from the data bus during the program operation; and wherein the second transfer circuit is structured to pull up/down the sense node depending on a logic state of the second latch node.

23. The non-volatile semiconductor memory device of claim 22, wherein the first transfer circuit is structured to transfer the data on the sense node to the latch during the read operation, and is structured to transfer the data in the latch to the data bus via the switch circuit.

24. The non-volatile semiconductor memory device of claim 22, wherein the first transfer circuit includes:
a first NMOS transistor having a source coupled to the internal node, a gate coupled to a first control signal, and a drain;
a second NMOS transistor having a source coupled to the drain of the first NMOS transistor, a drain coupled to the first latch node, and a gate coupled to a second control signal;
a third NMOS transistor having a source coupled to the drain of the first NMOS transistor, a drain coupled to the second latch node, and a gate coupled to a third control signal;
a fourth NMOS transistor having a drain coupled to the drain of the first NMOS transistor, a gate coupled to the sense node, and a source; and
a fifth NMOS transistor having a drain coupled to the source of the NMOS transistor, a source coupled to a ground voltage, and a gate coupled to a fourth control signal.

25. The non-volatile semiconductor memory device of claim 22, wherein the second transfer circuit first and second pull-up transistors are serially coupled between a power supply voltage and the sense node and first and second pull-down transistors are serially coupled between the sense node and the ground voltage; and
wherein the first and second pull-up transistors are switched according to a logic state of the second latch node, the second pull-up transistor is switched according to a load control signal, and the first pull-up transistor is switched according to an inverted version of the load control signal.

26. The non-volatile semiconductor memory device of claim 21, further comprising a separate page copy flag cell for storing information to detect whether copied page data is inverted.

27. The non-volatile semiconductor memory device of claim 26, wherein, when a page copy-back operation is carried out, the data on the sense node is transferred to the latch via a first transfer circuit of one of the first and second sense and latch blocks, and then the data held in the latch is transferred to the sense node via a second transfer circuit.

28. The non-volatile semiconductor memory device of claim 27, wherein when one of the first and second sense and latch blocks carries out a page copy-back operation, the other sense and latch block becomes inactive.

29. The non-volatile semiconductor memory device of claim 24, wherein the second and third control signals are complementary signals.

30. The non-volatile semiconductor memory device of claim 24, wherein logic states of the second and third control signals are determined depending on data to be programmed during the program operation.

31. The non-volatile semiconductor memory device of claim 24, wherein the second control signal is activated when the data on the sense node is transferred to the latch, and the third control signal is activated when the latch is set to a predetermined logic state and data in the latch is transferred to the data bus.

32. A method of programming data in a non-volatile semiconductor memory device comprising a memory cell array, a plurality of unit page buffers, and a column gate circuit for selecting at least one of the unit page buffers to couple the selected unit page buffer to a data bus, the method comprising:
loading data to a first sense and latch block of the selected unit page buffer;
using the data in the first sense and latch block to carry out a first program operation and concurrently to load data to a second sense and latch block of the selected unit page buffer; and
using the data in the second sense and latch block to carry out a second program operation and concurrently to load data to the first sense and latch block.

33. The method of claim 32, further comprising repeating the first and second program operations until all page data is programmed to the memory cell array.

34. A method for reading data in a non-volatile semiconductor memory device comprising a memory cell array, including a plurality of cell strings each being electrically connected to corresponding their bitlines, wherein among the corresponding bitlines, two adjacent bitlines constitute a bitline pair; a plurality of unit page buffers each being coupled to the bitline pairs; and a column gate circuit for selecting at least one of the unit page buffers to couple the selected unit page buffer to a data bus, the method comprising:
sensing data from the memory cell array via one of a pair of bitlines corresponding to the selected unit page buffer;
latching the sensed data to a first sense and latch block of the selected unit page buffer;
outputting the data in the first sense and latch block to the exterior of the memory device and concurrently sensing data from the memory cell array via the other bitline corresponding to the selected unit page buffer, and
latching the sensed data to a second sense and latch block of the selected unit page buffer.

35. The method of claim 34, further comprising repeating the sense operations until all page data is all output to the exterior of the memory device.

36. A copy-back method in a non-volatile semiconductor memory device comprising a memory cell array including a plurality of cell strings each being electrically connected to corresponding their bitlines, wherein among the corresponding bitlines, two adjacent bitlines constitute a bitline pair, and each of the cell strings has memory cells each being coupled to corresponding their wordlines; a plurality of unit page buffers each being coupled to the bitline pairs; and a column gate circuit for selecting at least one of the unit page buffers to couple the selected unit page buffer to a data bus, the method comprising:
sensing data from memory cells coupled to a selected one of the wordlines,
latching the sensed data in a first or second sense and latch block of the respective unit page buffers; and
programming the data latched in the first or second sense and latch block to memory cells of the wordlines except the selected one of the wordlines,
wherein the latched data has the same state as the programmed data.

* * * * *

UNITED STATES PATENT AND TRADEMARK OFFICE
CERTIFICATE OF CORRECTION

PATENT NO. : 6,717,857 B2 Page 1 of 1
DATED : April 6, 2004
INVENTOR(S) : Byeon et al.

It is certified that error appears in the above-identified patent and that said Letters Patent is hereby corrected as shown below:

Column 5,
Line 35, "signal Data1, and" should read -- signal Data1, and --.
Line 45, "signal Data1 is" should read -- signal Data1 is --.
Lines 48 and 49, "signal Data1 has" should read -- signal Data1 has --.

Column 6,
Line 1, "transistors MN1-MN17." should read -- transistors MN11-MN17. --.
Line 59, "BLi_O. During" should read -- BLi_0. During --.

Column 7,
Line 58, "signal SWI transitions" should read -- signal SW1 transitions --.

Column 10,
Line 18, "and nddata1 transition" should read -- and nDdata1 transition --.

Column 11,
Line 11, "BL0_E and BL0, each" should read -- BL0_E and BL0_O, each --.

Signed and Sealed this

Fifth Day of April, 2005

JON W. DUDAS
*Director of the United States Patent and Trademark Office*